United States Patent
Terashima

(10) Patent No.: US 7,053,479 B2
(45) Date of Patent: May 30, 2006

(54) PACKAGE OF SEMICONDUCTOR DEVICE AND ITS MANUFACTURING METHOD

(75) Inventor: Kazuhiko Terashima, Tokyo (JP)

(73) Assignee: Citizen Watch Co., Ltd., Tokyo (JP)

(*) Notice: Subject to any disclaimer, the term of this patent is extended or adjusted under 35 U.S.C. 154(b) by 0 days.

(21) Appl. No.: 10/472,904

(22) PCT Filed: Mar. 25, 2002

(86) PCT No.: PCT/JP02/02836

§ 371 (c)(1),
(2), (4) Date: Sep. 25, 2003

(87) PCT Pub. No.: WO02/078079

PCT Pub. Date: Oct. 3, 2002

(65) Prior Publication Data

US 2004/0097094 A1     May 20, 2004

(30) Foreign Application Priority Data

Mar. 26, 2001 (JP) .............................. 2001-086717

(51) Int. Cl.
*H01L 23/48* (2006.01)

(52) U.S. Cl. .................. 257/689; 257/730; 257/780

(58) Field of Classification Search ................ 257/689, 257/701, 730, 737, 780
See application file for complete search history.

(56) References Cited

U.S. PATENT DOCUMENTS

| | | | | |
|---|---|---|---|---|
| 5,869,904 A | * | 2/1999 | Shoji | 257/779 |
| 6,404,051 B1 | * | 6/2002 | Ezawa et al. | 257/734 |
| 6,404,062 B1 | * | 6/2002 | Taniguchi et al. | 257/778 |

FOREIGN PATENT DOCUMENTS

| | | |
|---|---|---|
| EP | 0 766 310 | 4/1997 |
| JP | 4-082241 | 3/1992 |
| JP | 6-333931 | 12/1994 |
| JP | 07-122591 | 5/1995 |
| JP | 8-222573 | 8/1996 |
| JP | 11-186325 | 7/1999 |
| JP | 11-284022 | 10/1999 |
| JP | 11-297748 | 10/1999 |
| JP | 11-340269 | 12/1999 |
| JP | 2000-174050 | 6/2000 |

OTHER PUBLICATIONS

International Preliminary Report (PCT/IPEA/409) (translated) issued for PCT/JP02/02836.
Notification of Transmittal of Copies of Translation of the International Preliminary Examination Report (PCT/IB/338) issued for PCT/JP02/02836.
First Examination Report - Chinese Patent Office with partial translation.

* cited by examiner

*Primary Examiner*—George Fourson
*Assistant Examiner*—Fernando L. Toledo
(74) *Attorney, Agent, or Firm*—Smith, Gambrell & Russell, LLP

(57) ABSTRACT

A packaged semiconductor device structure comprises a semiconductor chip (20) having a bump electrode (5), a facing substrate (9) having on one face thereof a facing electrode (8) contacting an end face of the bump electrode (5) and a bonding agent (7) filled in between the semiconductor chip (20) and the facing substrate (9). The bump electrode (5) is of a double layer structure composed of a core part (5b) and a convex-shaped electrode end part (5a) fabricated above the core part (5b) separately from the core part.

1 Claim, 4 Drawing Sheets

PACKAGE OF SEMICONDUCTOR DEVICE AND ITS MANUFACTURING METHOD

TECHNICAL FIELD

This invention relates to a packaged semiconductor device structure configured so that a semiconductor chip having a bump electrode is mounted on a facing wiring substrate, and a method for fabricating the packaged semiconductor device structure.

BACKGROUND ART

In Japanese Patent Applications Laid-open Nos. 4-82241 and 11-284022, there is disclosed a technology of mounting a semiconductor element having a bump electrode on a facing wiring substrate in such a way that a thermosetting bonding insulating resin is filled in between the semiconductor element and the wiring substrate to press the bump electrode of the semiconductor element against the wiring substrate so that the wiring substrate and an electrode on the wiring substrate are subjected to plastic or elastic deformation into a concave shape to ensure that the semiconductor element is electrically connected to the electrode on the wiring substrate. The bump electrode of the above semiconductor element is one deposited on a pad electrode of the semiconductor element using a metal material such as Au by electroplating or the like.

An approach to deposition of the bump electrode as described above fails to adjust a tip end shape of the bump electrode. Thus, with the bump electrode pressed against the wiring substrate, the tip end shape of the bump electrode is not sufficiently in agreement with a shape of the electrode on the wiring substrate deformed by being pressed against the bump electrode, so that stabled electric connection is sometimes unattainable.

DISCLOSURE OF THE INVENTION

An object of the present invention is to provide a packaged semiconductor device structure, which is highly reliable in mounting a semiconductor chip having a bump electrode to a facing substrate having on a surface thereof a facing electrode to ensure that sufficient electric connection between the bump electrode and the facing electrode is attainable without damaging the facing electrode, and a method for fabricating the above packaged semiconductor device structure as well.

In order to attain the above object, a packaged semiconductor device structure according to the present invention comprises a semiconductor chip having a bump electrode; a resin-made facing substrate having on one face thereof a facing electrode contacting an end face of the above bump electrode; and an insulating, thermoplastic or thermosetting or photo-curing bonding agent filled in between the semiconductor chip and the facing substrate. In addition, the bump electrode is of a double-layer structure composed of a core part and a convex-shaped electrode end part fabricated on the core part separately from the core part.

The electrode end part composing the bump electrode may be rounded dependent on an amount of a material of the electrode end part by heating this electrode end part material, and is thus easily adjustable to suit properties of materials of the facing substrate and the facing electrode. Thus, sure electric connection between the bump electrode and the facing electrode is attainable.

BEST MODE FOR CARRYING OUT THE INVENTION

A first embodiment of a packaged semiconductor device structure according to the present invention will now be described with reference to FIGS. 1 and 3A to 3D.

Figure 1:
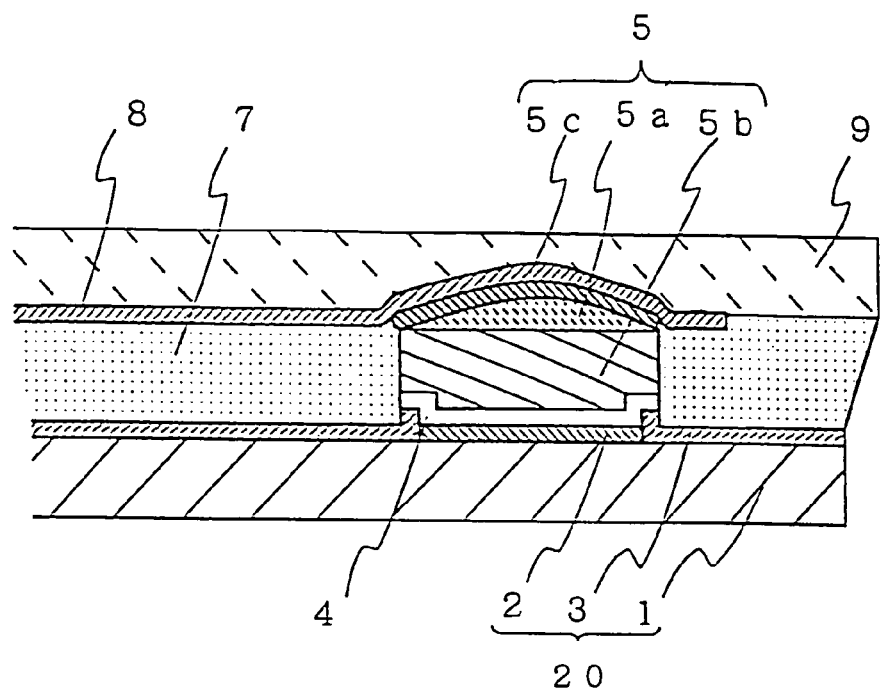
FIG. 1 is a cross-sectional view showing a packaged semiconductor device structure according to a first embodiment of the present invention.

In FIG. 1, a silicon single crystal substrate 1 of about 0.3 mm to 1.0 mm in thickness has thereon a semiconductor integrated circuit such as an active element, a logic circuit and a circuit interconnection. The substrate 1 is to configure a semiconductor chip 20, in cooperation with a pad electrode 2 and a passivation 3 respectively on the substrate 1. The pad electrode 2 is to connect a power source and/or a signal-related interconnection of the semiconductor integrated circuit on the substrate 1 to the outside. The passivation 3 has an opening at a portion facing the pad electrode 2, and is effective in protecting the semiconductor integrated circuit on the substrate 1.

In addition, the pad electrode 2 and the passivation 3 around the outside of the pad electrode have thereon a bump electrode 5. The bump electrode 5 has an upper end face whose center part is protruded into a rounded convex shape (partial spherical shape).

The bump electrode 5 on the semiconductor chip 20 is electrically connected to a facing electrode 8 of a resin-made facing substrate 9 with an insulating bonding agent 7 filled in between the semiconductor chip 20 and the facing substrate 9. With the bump electrode 5 electrically connected to the facing electrode 8, the facing substrate 9 is in a concavely deformed condition so as to be fitted with the convex-shaped upper end face of the bump electrode 5, as shown in FIG. 1.

In fabrication of a packaged structure of FIG. 1, either of the semiconductor chip 20 or the facing substrate 9 is firstly coated with an insulating bonding agent 7. Next, the bump electrode 5 on the semiconductor chip 20 is adhered to the facing electrode 8 on the facing substrate 9 under conditions of pressure bonding by heating so as to allow low pressure bonding stress to be held for a certain period of time at temperatures equal to or less than a glass transition temperature (Tg) of a material of the facing substrate 9, specifically, at which the insulating bonding agent 7 becomes hardened. Adhesion of the bump electrode 5 to the facing electrode 8 as described above allows the facing substrate 9 and the facing electrode 8 to be deformed so as to have a concave part in conformity with the convex-shaped end face of the bump electrode 5. As a result, the semiconductor chip 20 is electrically connected to the facing electrode 8 through engagement of the convex-shaped end face of the bump electrode 5 with the concave part on the facing electrode 8.

In deposition of the bump electrode 5, a core layer 5b is firstly deposited on an upper surface of a barrier metal layer 4, and thereafter, an electrode end part 5a is deposited on the core layer. A metal material having a melting point higher than that of the electrode end part 5a is used for the core layer 5b. Selective melting applied to the electrode end part 5a ensures that surface tension of molten metal thereof allows the end face of the bump electrode 5 to be deformed into an approximately partial spherical shape. Even if the electrode end part 5a having a spherical surface whose radius of curvature is increased leads to insufficient height of the bump electrode 5, the bump electrode 5 is adjustable in height so as to meet a required height by increasing a thickness of the core layer 5b.

In addition, the bump electrode 5 may also have on an uppermost layer thereof a bump electrode coating 5c. The bump electrode coating 5c is effective in preventing the surface of the bump electrode 5 from being oxidized, and also of ensuring satisfactory connection to the facing electrode 8.

The electrode end part 5a of the bump electrode 5 preferably needs to use a material having an elasticity modulus higher than that of the material of the facing substrate 9 and also having a melting point higher than Tg of the material of the facing substrate 9. For instance, highly conductive metals such as Au, Ag, Sn, Ni and Pb and plastics containing these metals are available. When the bump electrode 5 having the electrode end part 5a formed with the above material is subjected to heating and pressure bonding to the facing substrate 9 under the above conditions of pressure bonding by heating, a pressure bonding stress applied to the facing electrode 8 is appropriately dispersed in such a way as to be absorbed by the facing substrate 9 to ensure that the facing substrate 9 is plastically deformed so as to have the concave part. As a result, the bump electrode 5, with its shape maintained, may attain satisfactory electric connection to the facing electrode 8. The facing substrate 9 having the concave part whose depth is set as much as about 5 μm is effective in compensating for height variations of the bump electrode 5 in the range of 1 to 2 μm, even if the above variations occurred.

The facing substrate 9 preferably needs to use a thermoplastic or thermosetting resin material excellent in insulation and smoothness or the like, and more preferably, a resin composition having Tg lower than the melting point of the material used for the bump electrode 5. For instance, a thin sheet or a film that consists of thermoplastic resin such as polycarbonate, polyethersulfone and liquid crystal polymer or thermosetting resin such as epoxy and polyimide is available. These resin materials may be optionally added with fillers or covered with a gas barrier layer.

For easy deformation of the facing substrate 9 and the facing electrode 8 so as to have the concave part in conformity with the end face shape (convex shape) of the bump electrode 5, the facing electrode 8 preferably needs to use a single-layered or multi-layered film material consisting of highly conductive and/or elongate-able metal such as Al, Cu, Ni and Au of 10 μm or less in thickness or a composition containing these metals, more preferably, a multi-layered film obtained by depositing an Au film of 1 μm or less in thickness on an upper layer of a Cu film of 10 μm or less in thickness.

Further, in a transparent electrode used for a liquid crystal display, an indium tin oxide (which will be hereinafter simply referred to as ITO) film of 1 μm or less in thickness is preferably used for the facing electrode. Further, when the above ITO film is used, an upper layer thereof may have a single-layered or multi-layered film consisting of metal such as Al, Cu and Au of 1 μm or less in thickness or a composition containing these metals.

With considerations of bonding the semiconductor chip 20 to the facing substrate 9, the insulating bonding agent 7 preferably needs to use a material that may be sufficiently hardened under the conditions of pressure bonding by heating at temperatures equal to or less than a melting point of the bump electrode 5, specifically, equal to or less than Tg of the material of the facing substrate 9. Thus, the material of the insulating bonding agent 7 may include a thermoplastic or thermosetting or photo-curing resin composition, preferably, a thermosetting resin composition that may be hardened within a range of temperatures equal to or less than Tg of the facing substrate 9. For instance, a resin composition such as acrylic, urethane or epoxy resin is preferably available.

In bonding the semiconductor chip 20 to the facing substrate 9, the process of firstly coating either of the semiconductor chip 20 or the facing substrate 9 with the insulating bonding agent 7 in advance of subjecting the bump electrode 5 of the semiconductor chip 20 to heating and pressure bonding to the facing substrate 9 has been described. Alternatively, the above bonding may also take place in such a way as to allow the insulating bonding agent 7 to be filled and hardened after pressure bonding of the bump electrode 5 to the facing electrode 8.

In addition, the pad electrode 2 of the semiconductor chip 20 and the bump electrode 5 may also have therebetween a barrier metal layer 4 that is effective in preventing the metal materials of the pad electrode 2 and the bump electrode 5 from mutual diffusion.

An embodiment of a method for fabricating the packaged semiconductor device structure of FIG. 1 will now be described with reference to FIGS. 3A to 3D.

1. Process to deposit the core layer and the electrode end part of the bump electrode on the pad electrode on the substrate (See FIG. 3A)

The silicon single crystal substrate 1 has thereon the pad electrode 2 and the passivation 3 that are to compose the semiconductor chip. The passivation 3 is opened to ensure that only the surface of the pad electrode 2 is bared.

Firstly, the barrier metal layer 4 consisting of a Ti/W composition film of 0.5 μm in thickness is deposited by sputtering over the whole surface region including the passivation 3 and the pad electrode 2. Then, a plating resist coating 10 is deposited by photolithography on an upper surface region of the barrier metal layer 4, except for an upper part of the pad electrode 2.

Then, the core layer 5b is deposited on the barrier metal layer 4 above the pad electrode 2 with no plating resist coating 10 thereon in such a way as to allow Cu of 20 μm in thickness to be grown by electroplating using the barrier metal layer 4 as a common electrode film.

Further, the electrode end part 5a is deposited in such a way as to allow metal having a melting point lower than that of the core layer 5b, specifically, solder with Sn-to-Pb ratios of 6:4, to be grown by electroplating using the barrier metal layer 4 as the common electrode film.

Figure 3A:
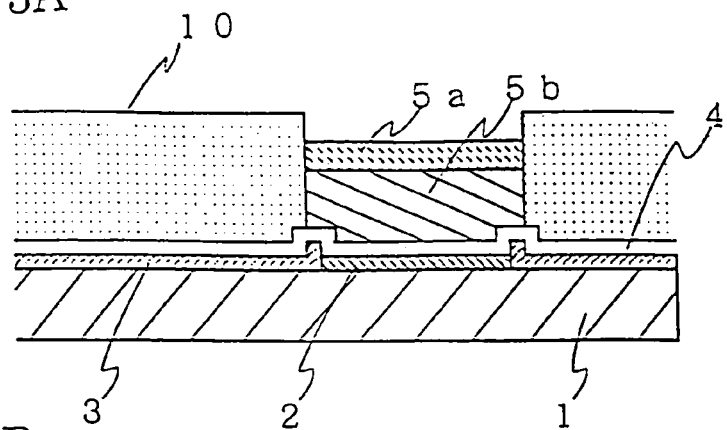
FIGS. 3A to 3D are views illustrating a method for fabricating the packaged semiconductor device structure shown in FIG. 1.

With the above process, a structure as shown in FIG. 3A is obtained.

2. Process to deform the end face (face contacting the facing electrode) of the bump electrode into a convex shape (approximately partial spherical shape) (See FIG. 3B):

Firstly, the silicon single crystal substrate 1 is allowed to stand for 20 seconds on a hot plate having a temperature of 200° C. Then, heat transmitted from the silicon single crystal substrate 1 causes only the electrode end part 5*a* of the bump electrode 5 to be melted to ensure that the surface tension of the molten electrode end part 5*a* allows the electrode end part 5*a* to be deformed into an approximately partial spherical shape. A radius of curvature of the spherical surface of the electrode end part 5*a* is easily adjustable depending on an amount of metal plating to be grown. Specifically, a decrease in metal plating amount increases the radius of curvature, thereby providing the electrode end part 5*a* having a gently rounded end face. On one hand, an increase in metal plating amount increases the height of the electrode end part 5, but decreases the radius of curvature of the end face of the bump electrode 5.

Further, the bump electrode coating 5*c* consisting of Au of 0.1 μm in thickness is deposited on the surface of the electrode end part 5*a* in a growing manner by electroplating.

Figure 3B:
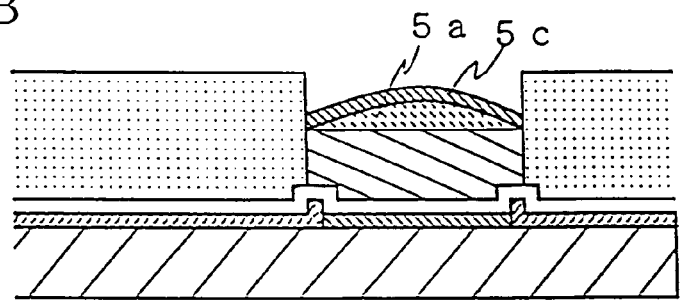

With the above process, a structure as shown in FIG. 3B is obtained.

3. Process to fabricate the semiconductor chip having the bump electrode (See FIG. 3C):

Firstly, the plating resist coating 10 of the structure shown in FIG. 3B is stripped using a commercially available resist stripper to bare the barrier metal layer 4 to the outside.

Then, the bared barrier metal layer 4 is etched with a hydrogen peroxide solution.

Figure 3C:
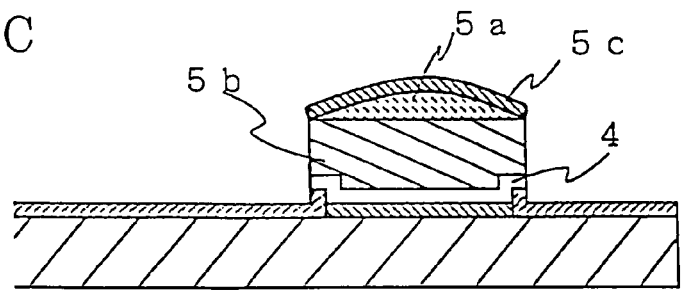
Figure 3D:
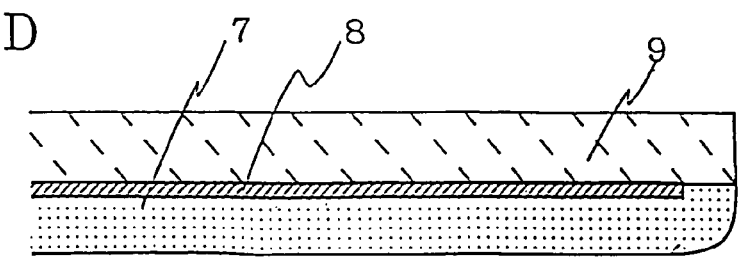
Figure 3D:
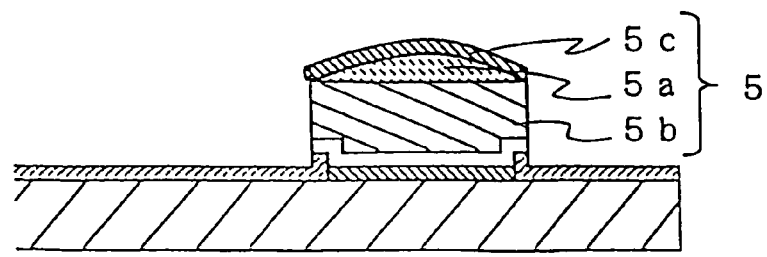

With the above process, a structure as shown in FIG. 3C is obtained.

4. Process to electrically connect the bump electrode 5 to the facing electrode 8 (See FIG. 3D):

Firstly, the ITO of 0.8 μm in thickness is deposited by sputtering on the facing substrate 9 consisting of polycarbonate resin of 0.2 mm in thickness to obtain the facing electrode 8 of a desired pattern by photolithography.

Further, the insulating bonding agent 7 consisting of an unhardened epoxy resin composition is supplied to a surface (surface to be packaged) of the facing substrate 9.

Next, the bump electrode 5 of the semiconductor chip (composed of the pad electrode 2 and the passivation 3) is slowly subjected to heating and pressure bonding to the facing electrode 8 on the facing substrate 9 at pressures of 40 Kg/cm² at 130° C., and then its bonded condition is maintained for 2 minutes. As a result, the facing substrate 9 and the facing electrode 8 are deformed so as to have the concave part in conformity with the tip end shape of the bump electrode 5. Then, sure electric connection between both the electrodes 5 and 8 is attainable through engagement of the convex-shaped (partially spherical-shaped) bump electrode 5 with the concave part of the facing electrode 8.

Simultaneously with the above pressure bonding, the semiconductor chip (composed of the pad electrode 2 and the passivation 3) is firmly bonded to the facing substrate 9 in such a way as to allow the insulating bonding agent 7 to be sufficiently hardened.

With the above process, the packaged structure shown in FIG. 1 is completely fabricated.

The bump electrode 5 of the packaged structure according to the present invention has the end face taking the shape of a partial spherical surface, and also ensures that the unhardened insulating bonding agent 7 in between contact faces of both the electrodes 5 and 8 is easily ejected therefrom in an initial stage of the process of subjecting the bump electrode 5 on the semiconductor chip to heating and pressure bonding to the facing electrode 8 on the facing substrate 9. As a result, the contact faces of both the electrodes 5 and 8 may be connected together directly (without being filled with the bonding agent 7).

In the above embodiment, supply of the unhardened insulating bonding agent 7 of the epoxy resin composition to the surface (surface to be packaged) of the facing substrate 9 takes place in advance of allowing the bump electrode 5 on the semiconductor chip to be adhered to the facing electrode 8 on the facing substrate 9. Alternatively, adhesion of the bump electrode 5 on the semiconductor chip to the facing electrode 8 on the facing substrate 9 may also take place in advance of supplying the unhardened liquid-state insulating bonding agent 7 to between the semiconductor chip and the facing substrate 9 in a dispensing manner, and the process of subjecting the semiconductor chip to heating and pressure bonding to the facing substrate 9 follows to allow both the electrodes 5 and 8 to be connected together.

In fabrication of the packaged semiconductor device structure according to the method of the present invention, satisfactory electric connection is also attainable even under low temperature or low pressure bonding stress conditions. Thus, when the packaged semiconductor device structure according to the present invention is mounted on the resin-made facing substrate 9, damages to the facing electrode on the facing substrate 9 may be minimized. Thus, according to the present invention, it is possible to provide a packaged semiconductor device structure adaptable to packaging of high density.

A second embodiment of a packaged semiconductor device structure of the present invention will now be described with reference to FIGS. 2, 4A to 4C and 5A to 5C.

Figure 2:
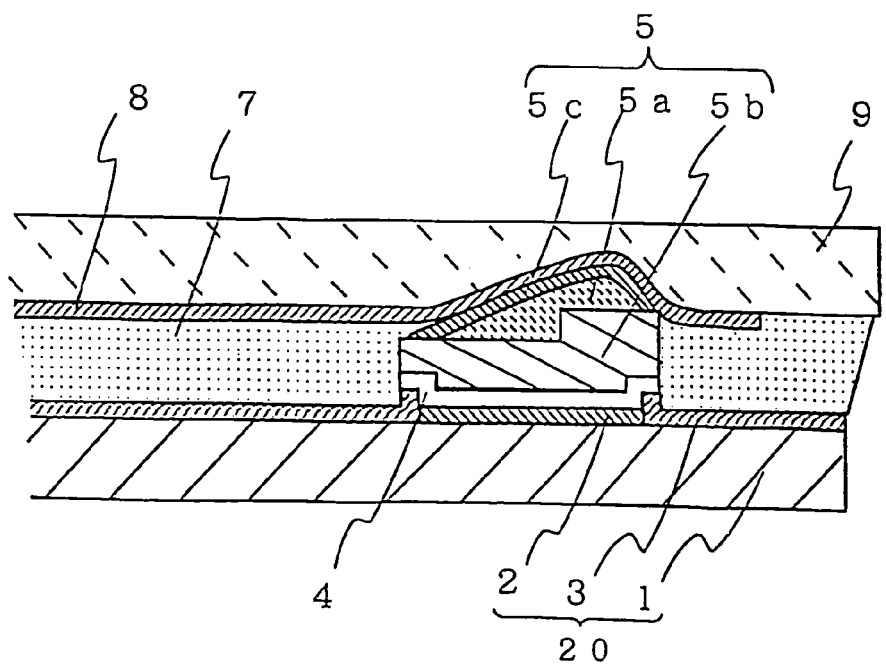
FIG. 2 is a cross-sectional view showing a packaged semiconductor device structure according to a second embodiment of the present invention.

The packaged semiconductor device structure shown in FIG. 2 has the bump electrode 5 whose core layer 5*b* has a step-like pattern, differently from the packaged structure of FIG. 1. The following will give a description on a method for fabricating the packaged structure of the second embodiment.

1. Process to deposit the core layer of the bump electrode on the pad electrode of the substrate (See FIG. 4A):

The same manner as that used for fabrication of the packaged structure of FIG. 1 is employed to deposit the electrode 2, the passiavation 3, the barrier metal layer 4 and the core layer 5*b*.

Specifically, the barrier metal layer 4 is deposited by sputtering over the whole surface region including the passivation 3 and the pad electrode 2. Then, the plating resist coating (not shown in FIG. 4A) is deposited by photolithography on an upper surface region of the barrier metal layer 4 except for an upper part of the pad electrode 2. Then, the core layer 5*b* is deposited on the barrier metal layer 4 above the pad electrode 2 with no plating resist coating thereon in such a way as to allow Cu of 20 μm in thickness to be grown by electroplating using the barrier metal layer 4 as the common electrode film. Further, the plating resist coating is stripped using a resist stripper, and a bared portion (specifically, a portion covered with no core layer 5*b*) of the barrier metal 4 is etched with the hydrogen peroxide solution, thereby providing a structure as shown in FIG. 4A.

Figure 4A:
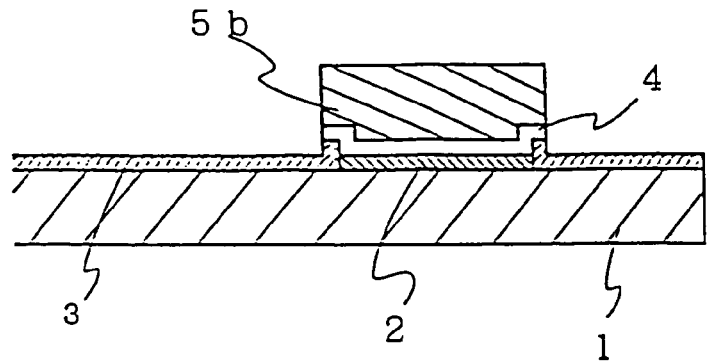
FIGS. 4A to 4C are views illustrating a method for fabricating the packaged semiconductor device structure shown in FIG. 2, specifically, a process up to a point at which a bump electrode having a step-like pattern is obtained in the course of fabrication of the packaged semiconductor device structure.
Figure 4B:
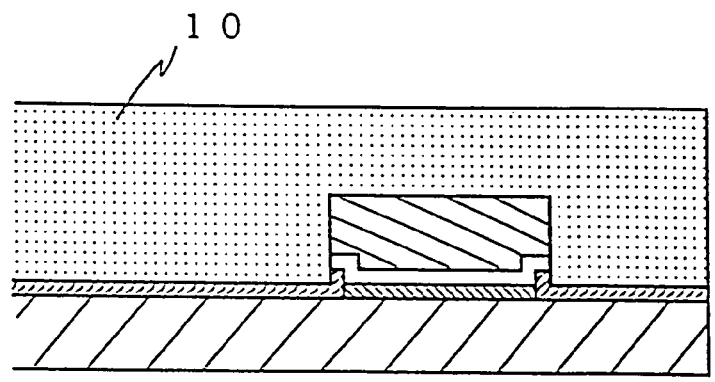

2. Process to deposit the plating resist coating (See FIG. 4B):

The plating resist coating 10 is deposited on the passivation 3 and the core layer 5b in such a way as to newly coat the structure of FIG. 4A with positive resist by spin coating, thereby providing a structure as shown in FIG. 4B.

Figure 4C:
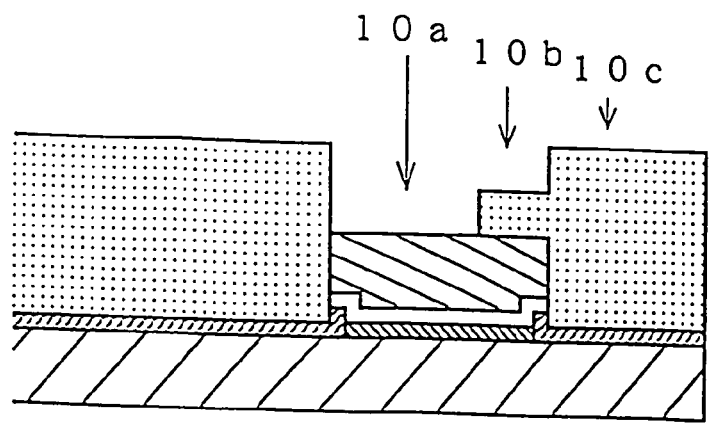

3. process to obtain a step-like resist pattern (See FIG. 4C)

The plating resist coating 10 in the structure shown in FIG. 4B is etched with a photolithography mask (not shown) consisting of a Cr material. Specifically, irradiation of ultraviolet rays from an exposure light source to the photolithography mask takes place to control decomposition of the resist depending on the extent of a quantity of ultraviolet rays for patterning as follows. That is, a first region 10a of the plating resist coating 10 is eliminated by etching to ensure that the core layer 5b is completely bared to the outside. A second region 10b thereof is etched halfway to ensure that the core layer 5b is covered with the plating resist coating 10 of a small thickness. A third region 10c thereof is assigned as a region subjected to no etching.

It is noted that the above first and second regions 10a and 10b are regions above the core layer 5b, and the third region 10c is a region out of an upper part position of the core layer 5b.

4. Process to subject the core layer to etching (See FIG. 5A):

The structure shown in FIG. 4C is subjected to dry etching. With this dry etching, etching of the core layer 5b in the first region 10a with the core layer 5b bared to the outside is started from the initial stage of dry etching, while etching of the core layer 5b in the second region 10b covered with the plating resist coating 10 of the small thickness is started after the plating resist coating 10 of the small thickness is eliminates by dry etching.

Figure 5A:
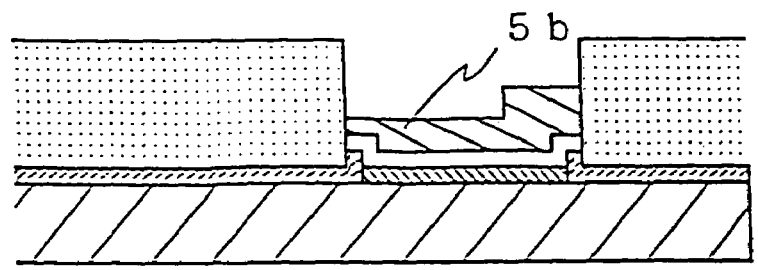
FIGS. 5A to 5C are views illustrating a method for fabricating the packaged semiconductor device structure shown in FIG. 2, specifically, a process from deposition of the bump electrode having the step-like pattern to deposition of an electrode end part and an electrode coating on the bump electrode.

A structure having the step-like core layer 5b as shown in FIG. 5A is obtained through the above dry etching.

The structure shown in FIG. 5A has the core layer 5b of two steps. Alternatively, for the core layer 5b of three or more steps, use of a photolithography mask having a pattern for varying a quantity of ultraviolet rays shielded in three or more levels is only needed.

Figure 5B:
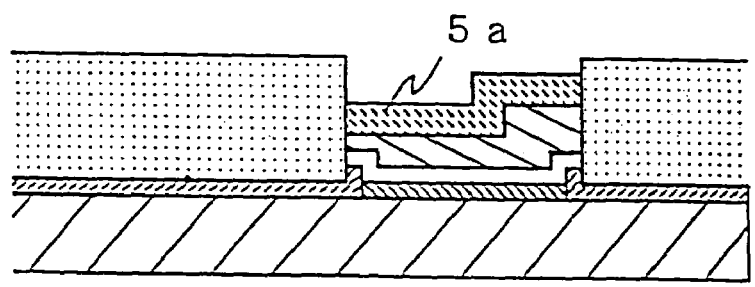

5. Process to deposit the electrode end part on the step-like core layer (See FIG. 5B):

As shown in FIG. 5B, the electrode end part 5a is deposited in an isotropic growing manner by electroplating.

Figure 5C:
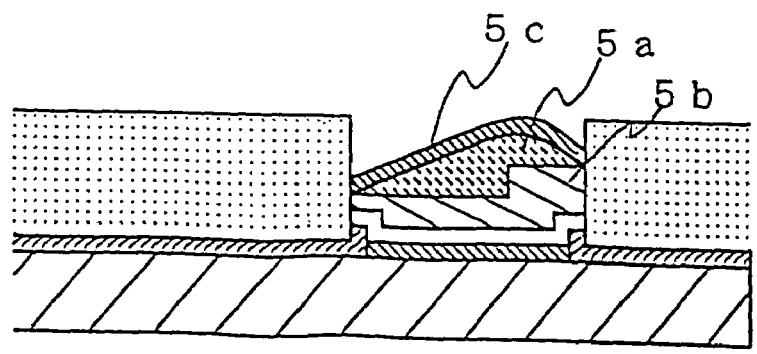

6. Process to deposit the bump electrode coating (See FIG. 5C):

After the electrode end part 5a of the step-like core layer is rounded by the same heat treatment as that in the first embodiment, the bump electrode coating 5c is deposited thereon by electroplating, thereby providing a structure as shown in FIG. 5C.

As described above, according to the present invention, the bump electrode on the semiconductor chip is of a two layer structure composed of the core layer and the electrode end part, so that the tip end of the electrode end part on the semiconductor chip may be formed in an arbitrary rounded shape, and is also easily adjustable to suit properties of the materials of the facing substrate and the facing electrode. Thus, sure electric connection between the bump electrode and the facing electrode is attainable.

As long as the gently rounded face of the electrode end part 5a is placed on the input side of the facing electrode 8, the damages to the input side of the facing electrode 8 in fabrication of the packaged structure may be minimized. Even if the facing electrode 8 opposite to the input side is damaged, there is no problem in driving of the semiconductor device. Thus, the present structure is considered to be one adaptable to packaging of further increased density, and besides, particularly effective in coping with a case where there is a possibility that damages to the bump electrode 8 are attributable to the materials or the like of the facing substrate 9 and the facing electrode.

The invention claimed is:

1. A packaged semiconductor device structure, comprising:
    a semiconductor chip having a bump electrode;
    a resin-made facing substrate having on one face thereof a facing electrode contacting an end face of said bump electrode; and
    an insulating bonding agent filled in between said semiconductor chip and said facing substrate;
    wherein said bump electrode is composed of a core part and a convex-shaped electrode end part fabricated on said core part separately from said core part;
    said electrode end part is formed with a material having an elasticity modulus higher than that of said facing substrate and also having a melting point higher than that of a glass transition temperature (Tg) of said facing substrate; and
    the semiconductor chip is electrically connected to the facing electrode through engagement of the convex-shaped end face of said bump electrode with a corresponding concave part formed on the facing electrode by being pressed by the convex-shaped end face of the bump electrode;
    wherein the core part of said bump electrode has a step-like pattern having two or three or more steps, further wherein the step-like pattern of the core part is formed such that a gently rounded face of the electrode end part is placed on an input side of the facing electrode.

* * * * *